United States Patent [19]
Weng

[11] Patent Number: 6,038,126
[45] Date of Patent: Mar. 14, 2000

[54] ELECTRICAL POWER SUPPLY ASSEMBLY

[75] Inventor: Hsien-Tang Weng, Taipei Hsien, Taiwan

[73] Assignee: Shin Jiuh Corp., Taipei Hsien, Taiwan

[21] Appl. No.: 09/295,150

[22] Filed: Apr. 21, 1999

[51] Int. Cl.⁷ ..................................................... H05K 5/00
[52] U.S. Cl. .......................... 361/679; 361/683; 361/724; 361/725; 361/727; 312/223.2
[58] Field of Search .................... 361/679, 683, 361/687, 729, 727, 735, 752, 756, 790, 796, 802; 312/223.1, 223.2; 211/41.12; 174/50, 52.1

[56] References Cited

U.S. PATENT DOCUMENTS

| | | | |
|---|---|---|---|
| 5,248,193 | 9/1993 | Schlemmer | 312/223.2 |
| 5,369,549 | 11/1994 | Kopp et al. | 361/679 |
| 5,612,854 | 3/1997 | Wiscombe et al. | 361/627 |
| 5,808,867 | 9/1998 | Wang | 361/695 |
| 5,808,876 | 9/1998 | Mullenbach et al. | 361/788 |
| 5,867,369 | 2/1999 | Antonuccio et al. | 361/796 |

*Primary Examiner*—Leo P. Picard
*Assistant Examiner*—Boris Chervinsky
*Attorney, Agent, or Firm*—Finnegan, Henderson, Farabow, Garrett & Dunner, L.L.P.

[57] ABSTRACT

An electrical power supply assembly includes a base member, a cover member connected to the base member to confine a space, at least one partitioning plate disposed between the base and cover members to divide the space into a plurality of side-by-side adjacent compartments, a plurality of rails disposed on the base and cover members and the partitioning plate, a plurality of electrical power supply units slidably disposed inside the space and having slide members held slidably by the rails, a rear cover attached to the base and cover members, an electrical circuit board mounted on the rear cover and electrically connected to the power supply units, and an electrical control box disposed outwardly of the space and connected to the base and cover members and the rear cover.

10 Claims, 5 Drawing Sheets

ELECTRICAL POWER SUPPLY ASSEMBLY

BACKGROUND OF THE INVENTION

1. Field of the Invention

This invention relates to an electrical power supply assembly, more particularly to an electrical power supply assembly holding therein a plurality of electrical power supply units which are aligned horizontally.

2. Description of the Related Art

Conventional electrical power supply units are normally stacked vertically in an electrical power supply assembly, as illustrated in FIG. 1. The conventional electrical power supply assembly 10 has an integral housing with a plurality of storing chambers 101 one above the other. Adjacent storing chambers 101 are partitioned by pairs of rails 12 mounted respectively on opposite side walls 11 of the housing, and a bar 14 transversely connected to the opposite side walls of the housing. An electrical power supply unit 20 is received inside each of the storing chambers 101, and is supported by the rails 12 so as to be slidable in and out of the storing chamber 101. The housing has screw hole 13 provided on each bar 14. Each electrical power supply unit 20 is provided with an ear member 21 that projects therefrom and that has an ear hole so that the power supply unit 20 can be fastened to the bars 14, via screws extending through the screw holes 13 and the ear holes, when the power supply unit 20 is placed inside the storing chamber 101.

The conventional electrical power supply assembly 10 is normally arranged in a manner that the power supply units 20 which are to be stored therein can only be stacked vertically. Such sn arrangement would occupy a space with a substantial height and is not suitable for placement at a location where height is limited.

In co-pending U.S. application Ser. No. 09/240,038, the applicant disclosed a power supply assembly which comprises a variable number of stacked modular containers, and an engaging unit and a fastening unit provided on each container to permit the containers to connect with one another. The container assembly holds an electrical power supply assembly which includes a plurality of electrical power supply units respectively received inside the stacked containers, and an electrical control device electrically connected to the electrical power supply units and received inside a control box mounted on the top or bottom of the stacked containers.

SUMMARY OF THE INVENTION

Therefore, it is an object of the present invention to provide an electrical power supply assembly that holds therein a plurality of juxtaposed electrical power supply units and that can be laid in a horizontal position.

According to the present invention, an electrical power supply assembly comprises: a U-shaped base member having a pair of first side plates and a first intermediate plate interconnecting the first side plates, the first side plates having first end faces which are opposite and substantially parallel to the first intermediate plate; a U-shaped cover member connected to the base member to confine a space, the cover member having a pair of second side plates and a second intermediate plate interconnecting the second side plates, the second side plates having second end faces which are opposite and substantially parallel to the second intermediate plate and which abut against the first end faces, respectively; connecting means disposed on the first and second end faces and interconnecting the first and second side plates; at least one partitioning plate disposed between the base and cover members to divide the space into a plurality of side-by-side adjacent compartments, the partitioning plate having two opposing ends connected respectively to the first and second intermediate plates; a plurality of rails extending along lines parallel to the first and second side plates inside the space, the rails being disposed on the partitioning plate, the first side plates, and the second side plates and being spaced apart vertically and aligned horizontally; a plurality of electrical power supply units slidably disposed inside the space and having slide members held slidably by the rails, respectively, at least one of the power supply units being received by each of the compartments; a rear cover attached to the base and cover members, the rear cover bridging the first intermediate plate and the second intermediate plate and further bridging the pairs of the first and second side plates; an electrical circuit board mounted on the rear cover and electrically connected to the power supply units; and an electrical control box disposed outwardly of the space and connected to one of the first side plates, one of the second side plates, and the rear cover.

BRIEF DESCRIPTION OF THE DRAWINGS

In drawings which illustrate a preferred embodiment of the invention.

DETAILED DESCRIPTION OF THE PREFERRED EMBODIMENT

Figure 1:
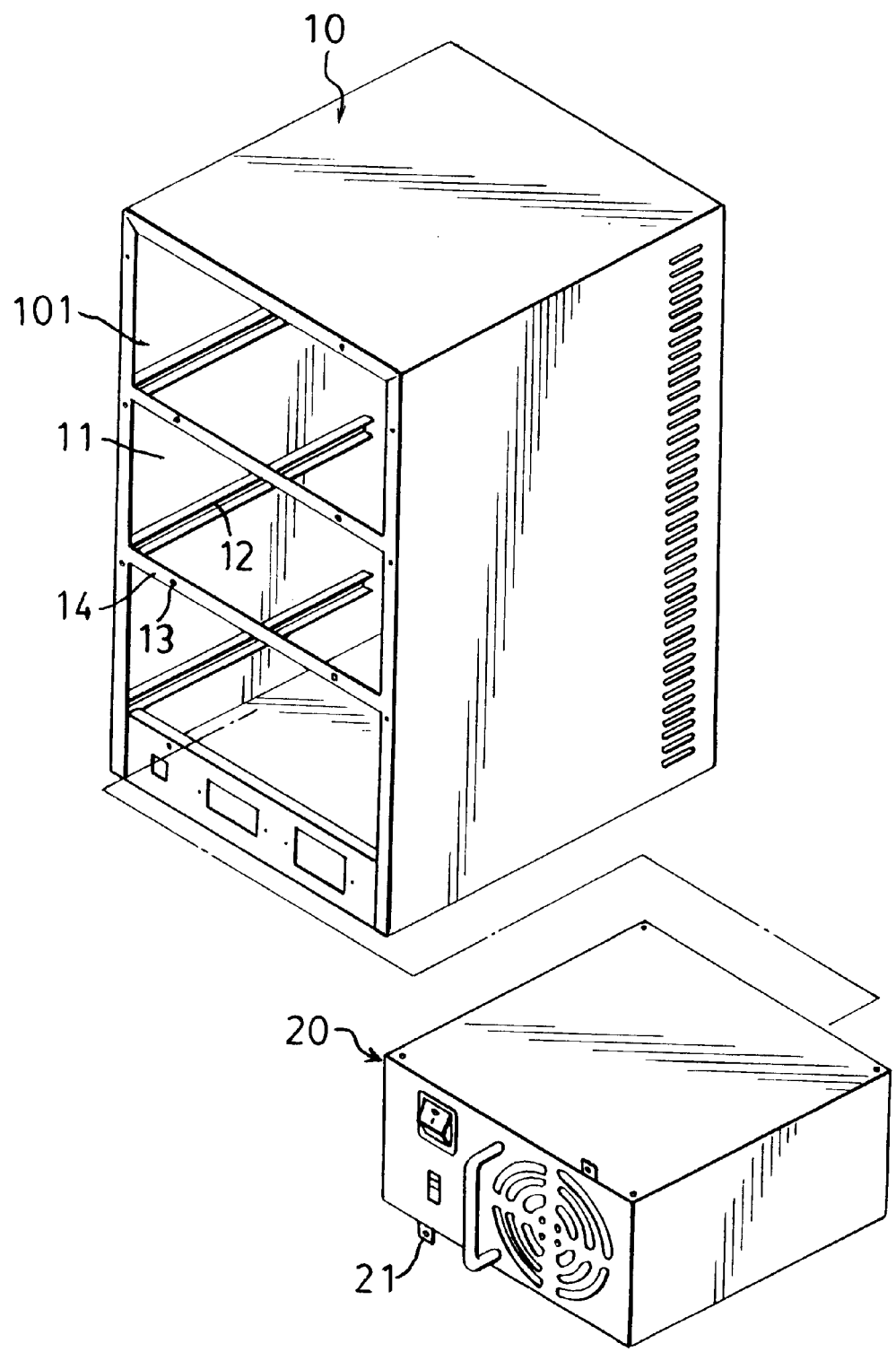
FIG. 1 is a perspective view of a conventional electrical power supply unit.
Figure 2:
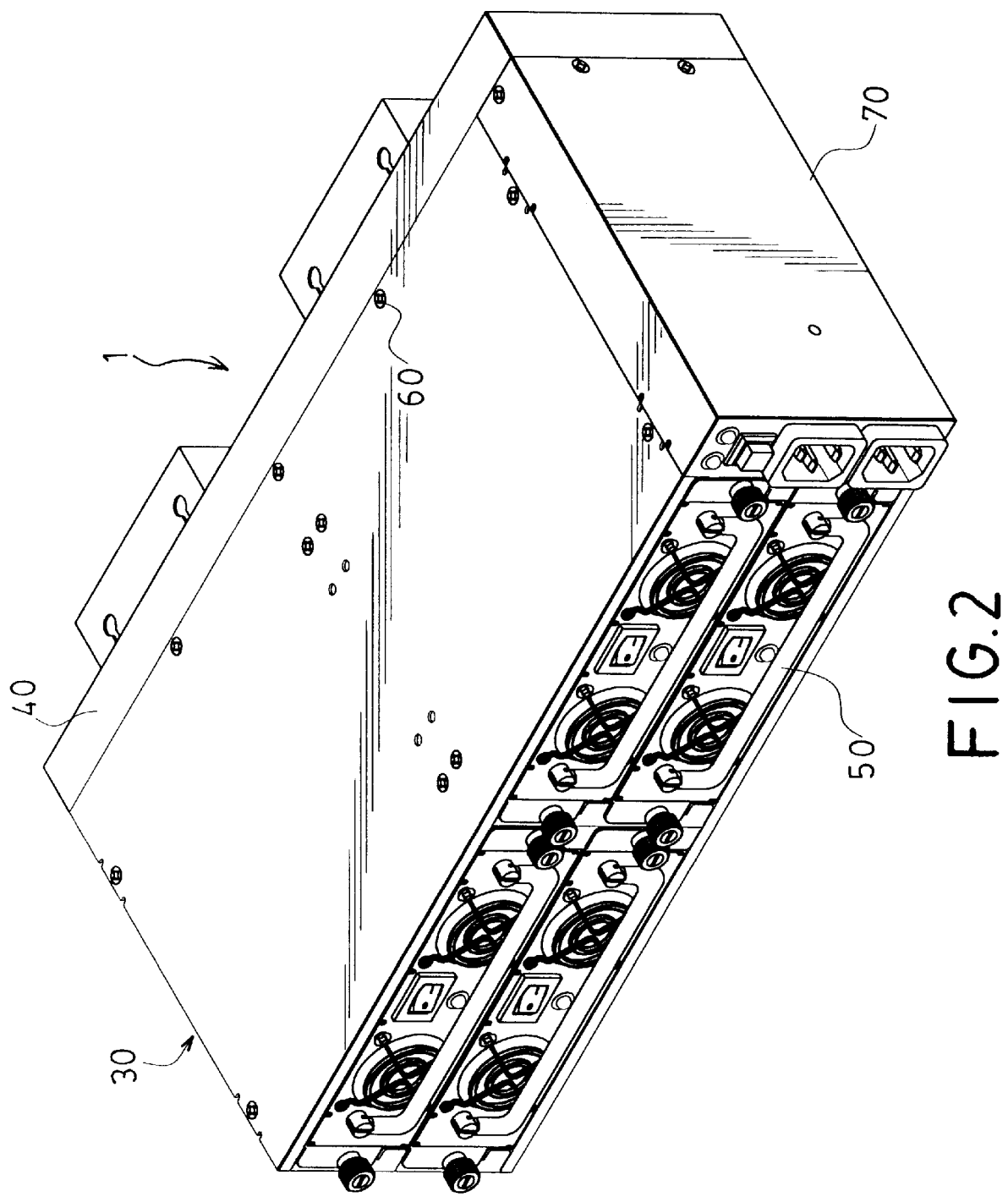
FIG. 2 is a perspective view of an electrical power supply assembly embodying the present invention.

FIG. 2 shows an electrical power supply assembly 1 embodying the present invention. The electrical power supply assembly 1 includes a container assembly 30, a rear cover 40, a control box 70, and four electrical power supply units 50 stored inside the container assembly 30.

Figure 3:
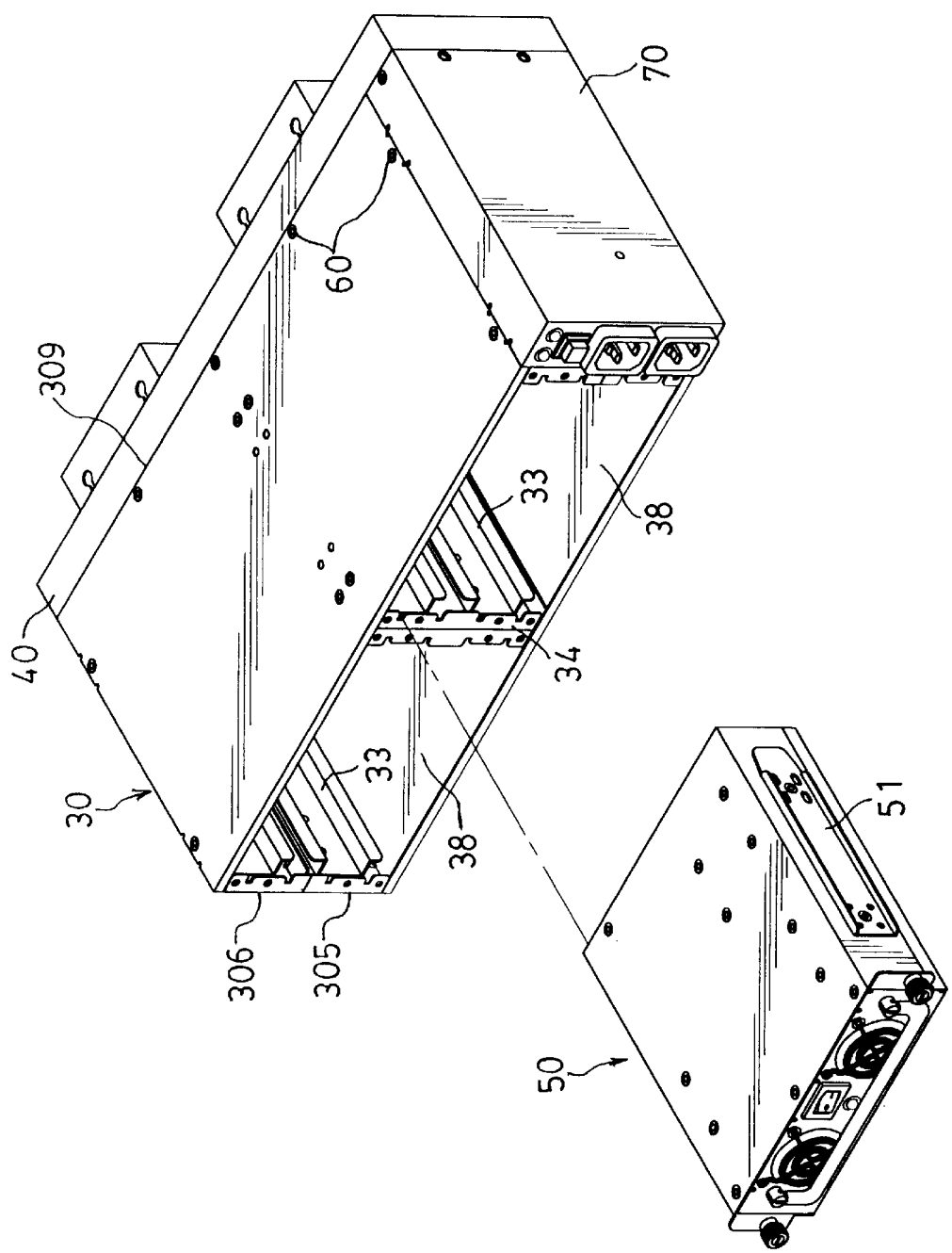
FIG. 3 is a perspective view of the electrical power supply assembly of FIG. 2 with electrical power supply units in a detached state.
Figure 4:
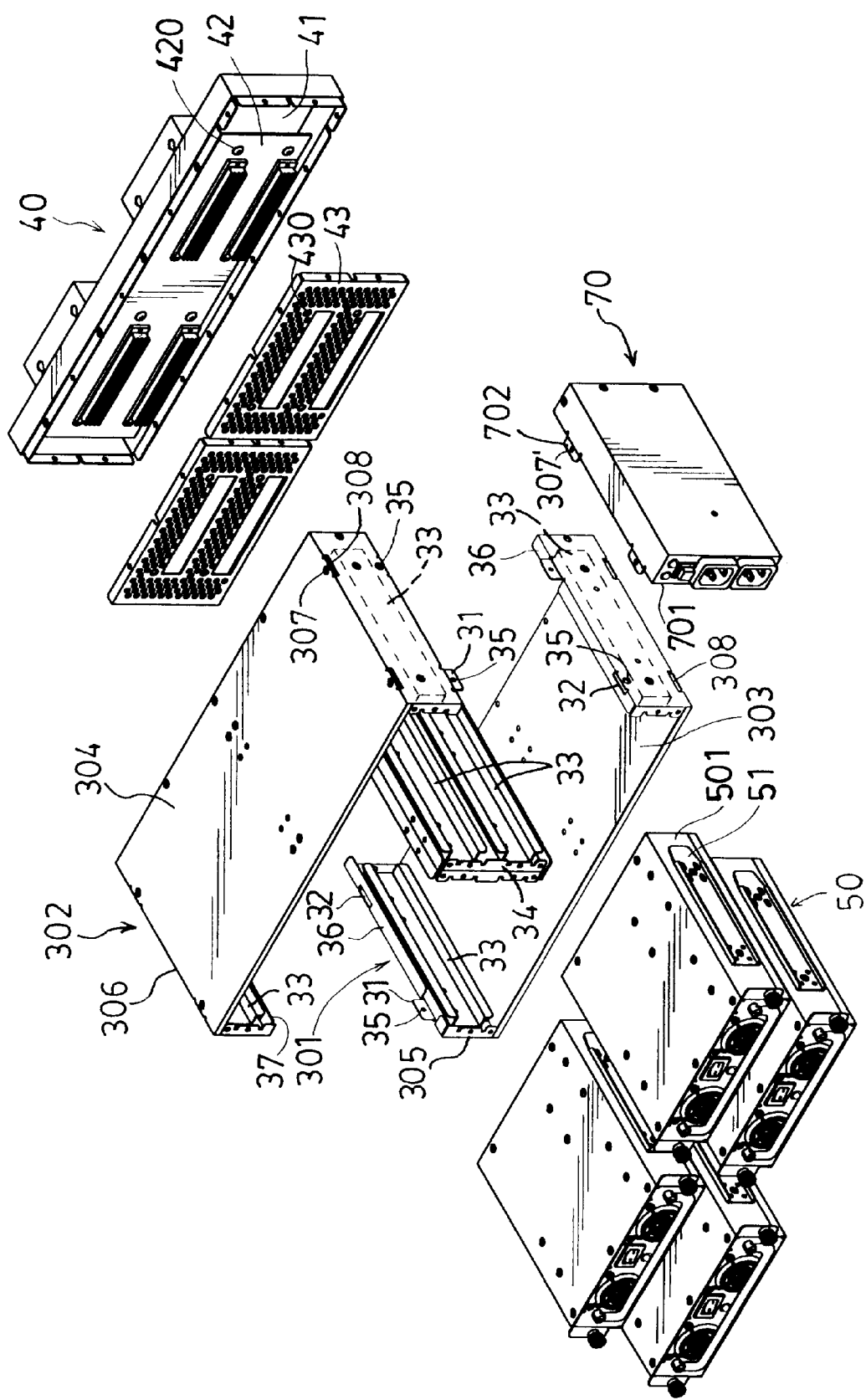
FIG. 4 is an exploded view of the electrical power supply assembly of FIG. 2.
Figure 5:
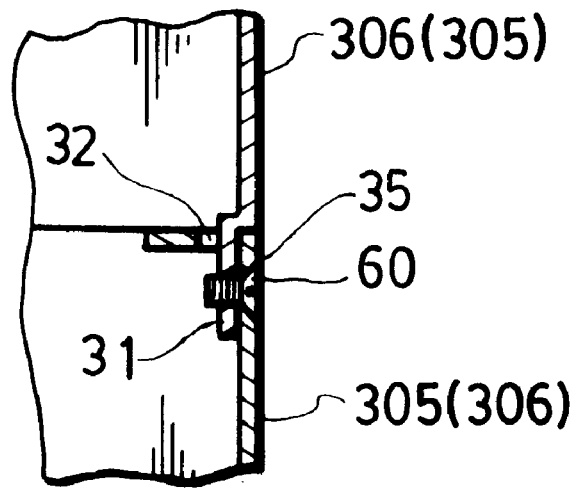
FIG. 5 shows a detailed connection set up by an ear piece and a slit in the electrical power supply assembly of FIG. 2.

As illustrated in FIGS. 3 and 4, the container assembly 30 includes a U-shaped base member 301 and a U-shaped cover member 302 connected to the base member 301 to confine a receiving space. The base and cover members 301, 302 have identical configuration and dimensions, and include first and second intermediate plates 303, 304, respectively. A pair of first side plates 305 and a pair of second side plates 306 are interconnected respectively by the first and second intermediate plates 303, 304. Each first side plate 305 has a right-angled first end flange 36 opposite and parallel to the first intermediate plate 303. Each second side plate 306 has a right-angled second end flange 37 opposite and parallel to the second intermediate plate 304. Each of the first and second end flanges 36, 37 has a first ear piece 31 projecting outwardly therefrom and a first slit 32 opposite to the first ear piece 31. Each first ear piece 31 is formed by cutting the corresponding one of the first and second end flanges 36, 37 to form a split part and by bending the split part to project outwardly therefrom. The first side plates 305 and the second side plates 306 are interconnected by insertion of the first ear pieces 31 into the corresponding first slits 32. As illustrated in FIG. 5, each inserted ear piece 31 is fastened to one of the adjacent first and second side plates 305, 306 by a screw extending through aligned screw holes 35 disposed in the first ear piece 31 and the first or second side plate 305, 306.

The container assembly 30 further includes a partitioning member 34 disposed between the base and cover members 301, 302 and having two opposing ends connected respectively to the first and second intermediate plates 303, 304 so as to divide the receiving space of the container assembly 30 into two side-by-side adjacent and horizontally aligned compartments 38. The partitioning member 34 is formed by joining two identical partitioning plates side-by-side.

Each of the first and second side plates 305, 306 is provided with a rail 33 extending along the line parallel to a corresponding one of the first and second side plates 305, 306. The rails 33 on the first and second side plates 305, 306 are spaced apart vertically inside the receiving space of the container assembly 30. The partitioning member 34 has two opposing faces which are also provided with rails 33 that are aligned horizontally with the rails 33 of the first and second side plates 305, 306, respectively, so that each compartment 38 is formed with two pairs of rails 33 therein. The rails 33 are screwed to the first and second side plates 305, 306 and the partitioning member 34.

There are four electrical power supply units 50, each of which has two opposing sides 501 provided respectively with slide members 51 so that the electrical power supply units 50 can be held slidably by the rails 33 in the compartments 38.

Two second slits 308 are formed in one of the first side plates 305 adjacent to the control box 70 and the first intermediate plate 303. Another two second slits 308 are formed in one of the second side plates 306 adjacent to the control box 70 and the second intermediate plate 304. The control box 70 has four second ear pieces 702 projecting outwardly from one side 701 of the control box 70 and inserted into the four second slits 308, respectively, so that the control box 70 can be fastened to the container assembly 30 by screws 60 (shown in FIG. 3) which extend through screw holes 307 in the first and second intermediate plates 303, 304 and screw holes 307' in the ear pieces 702.

Figure 6:
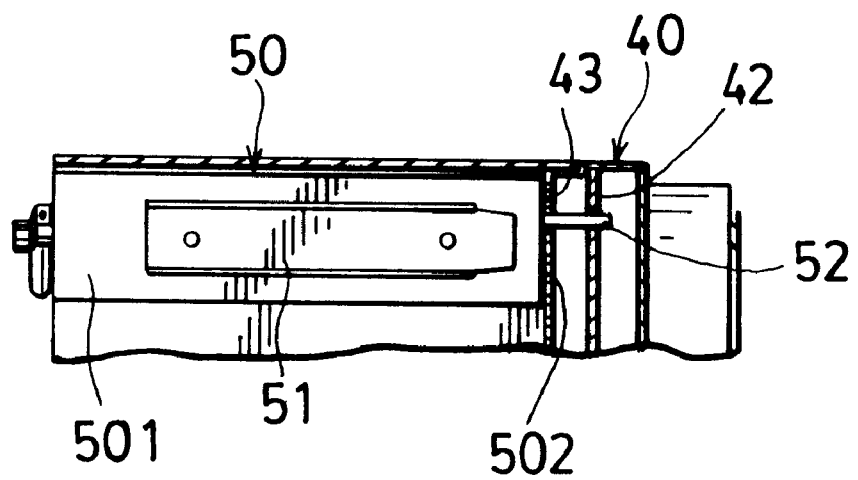
FIG. 6 is a fragmentary cross-sectional view of the electrical power supply assembly of FIG. 2.

The rear cover 40 disposed on a rear side 309 of the container assembly 30 bridges the first and second side plates 305, 306 as well as the first and second intermediate plates 303, 304, and extends to the control box 70. The rear cover 40 includes a chamber 41, an electrical circuit board 42 disposed within the chamber 41 to electrically connect the electrical power supply units 50 and the control box 70, and a spacer plate 43 disposed between the electrical circuit board 42 and the electrical power supply units 50. The rear cover 40 and the spacer plate 43 are provided with aligning holes 420, 430, respectively. As shown in FIG. 6, each electrical power supply unit 50 is provided at a rear side 502 with aligning pins 52 (only one is shown) that extend through corresponding aligning holes 420, 430 for proper alignment with the electrical circuit board 42.

With the invention thus explained, it is apparent that various modifications and variations can be made without departing from the spirit of the present invention. It is therefore intended that the invention be limited only as recited in the appended claims.

I claim:

1. An electrical power supply assembly, comprising:
   a U-shaped base member having a pair of first side plates and a first intermediate plate interconnecting said first side plates, said first side plates having first end faces which are opposite and substantially parallel to said first intermediate plate;
   a U-shaped cover member connected to said base member to confine a space, said cover member having a pair of second side plates and a second intermediate plate interconnecting said second side plates, said second side plates having second end faces which are opposite and substantially parallel to said second intermediate plate and which abut against said first end faces, respectively;
   first connecting means disposed on said first and second end faces and interconnecting said first and second side plates;
   at least one partitioning plate disposed between said base and cover members to divide said space into a plurality of side-by-side adjacent compartments, said partitioning plate having two opposing ends connected respectively to said first and second intermediate plates;
   a plurality of rails extending along lines parallel to said first and second side plates inside said space, said rails being disposed on said partitioning plate, said first side plates, and said second side plates and being spaced apart vertically and aligned horizontally;
   a plurality of electrical power supply units slidably disposed inside said space and having slide members held slidably by said rails, respectively, at least one of said power supply units being received by each of said compartments;
   a rear cover attached to said base and cover members, said rear cover bridging said first intermediate plate and said second intermediate plate and further bridging said pairs of said first and second side plates;
   an electrical circuit board mounted on said rear cover and electrically connected to said power supply units; and
   an electrical control box disposed outwardly of said space and connected to one of said first side plates, one of said second side plates, and said rear cover.

2. The electrical power supply assembly as claimed in claim 1, wherein said first connecting means includes a plurality of first slits and a plurality of first projecting ear pieces, said first slits and projecting ear pieces being disposed on said first and second end faces, said first projecting ear pieces being insertable into said first slits, respectively, to interengage said first and second end faces, said first connecting means further including a plurality of first fasteners to fasten said first ear pieces to corresponding ones of said first and second side plates.

3. The electrical power supply assembly as claimed in claim 1, wherein a pair of said power supply units are disposed one above the other in each of said compartments and are slidable along said rails.

4. The electrical power supply assembly as claimed in claim 1, wherein said first and second side plates and said first and second intermediate plates of said base and cover members have equal dimensions and configurations.

5. The electrical power supply assembly as claimed in claim 4, wherein said first connecting means includes a plurality of first slits, and a plurality of first ear pieces for insertion into said first slits, respectively, each of said first side plates having one of said first slits formed in the corresponding one of said first end faces and having one of said first earpieces projecting outwardly from the corresponding one of said first end faces in a direction substantially parallel to said first side plates, each of said second side plates having one of said first slits formed in a corresponding one of said second end faces and having one of said first ear pieces projecting outwardly from a corresponding one of said second end faces in a direction substantially parallel to said second side plates.

6. The electrical power supply assembly as claimed in claim 5, wherein said first and second side plates have right-angled end flanges which project inward from said first and second side plates and which are opposite to said first and second intermediate plates, said first and second end faces being formed on said end flanges, respectively.

7. The electrical power supply assembly as claimed in claim 6, wherein each of said end flanges is punched to form one of said first slits and is further cut to form a split part, said split part being bent to form one of said first ear pieces.

8. The electrical power supply assembly as claimed in claim 5, further comprising second connecting means for connecting said control box to said rear cover and said base and cover members, said second connecting means including a plurality of second slits which are formed in one of said first side plates adjacent to said control box and one of said second side plates adjacent to said control box and which are located adjacent to said first and second intermediate plates, a plurality of second ear pieces projecting from said control box and passing through said second slits, respectively, to extend adjacent to said first and second intermediate plates, and a plurality of second fasteners to fasten said second ear pieces to said first and second intermediate plates.

9. The electrical power supply assembly as claimed in claim 1, further comprising a spacer plate disposed between said electrical circuit board and said power supply units.

10. The electrical power supply assembly as claimed in claim 1, wherein said electrical circuit board includes a plurality of aligning holes, each of said power supply units having at least one pair of aligning pins projecting rearwardly and extending into a corresponding ones of said aligning holes for proper alignment with said electrical circuit board.

* * * * *